United States Patent
Shinder

(10) Patent No.: US 11,424,846 B1
(45) Date of Patent: Aug. 23, 2022

(54) RECURSIVE SERIALIZERS AND DESERIALIZERS

(71) Applicant: THE BOEING COMPANY, Chicago, IL (US)

(72) Inventor: Sam Shinder, Gaithersburg, MD (US)

(73) Assignee: THE BOEING COMPANY, Chicago, IL (US)

( * ) Notice: Subject to any disclaimer, the term of this patent is extended or adjusted under 35 U.S.C. 154(b) by 27 days.

(21) Appl. No.: 17/169,259

(22) Filed: Feb. 5, 2021

(51) Int. Cl.
  *H04J 3/04* (2006.01)
  *H03M 9/00* (2006.01)
  *H03K 3/037* (2006.01)
  *H04J 3/02* (2006.01)

(52) U.S. Cl.
  CPC .............. *H04J 3/047* (2013.01); *H03K 3/037* (2013.01); *H03M 9/00* (2013.01); *H04J 3/02* (2013.01)

(58) Field of Classification Search
  CPC .............. H03M 9/00; H04J 3/04; H04J 3/047
  See application file for complete search history.

(56) References Cited

U.S. PATENT DOCUMENTS

| | | |
|---|---|---|
| 6,542,096 B2 | 4/2003 | Chan et al. |
| 6,628,679 B1 | 9/2003 | Talarek |
| 7,006,021 B1 * | 2/2006 | Lombaard ............... H03M 9/00 341/100 |
| 7,392,334 B2 * | 6/2008 | Padaparambil ......... H03M 9/00 710/36 |
| 7,864,084 B2 * | 1/2011 | Padaparambil ........ H03K 5/135 341/100 |
| 7,890,680 B2 | 2/2011 | Huff |
| 2007/0008991 A1 | 1/2007 | Sridharan et al. |

* cited by examiner

*Primary Examiner* — Patrick O Neill
(74) *Attorney, Agent, or Firm* — The Small Patent Law Group LLC; Joseph M. Butscher

(57) ABSTRACT

A serializer includes a recursive tree of serializer unit cells. Each serializer unit cell includes a multiplexer and a plurality of flip-flops coupled to the multiplexer. Each serializer unit cell contains a state machine defining operation of the corresponding serializer unit cell. The recursive tree is organized with upper level serializer unit cells disposed more closely to a serializer output than are lower level serializer unit cells. The recursive tree is configured such that each serializer unit cell that is adjacent to and in an upper position relative to a corresponding lower level serializer unit cell directs the corresponding lower level serializer unit cell to output data, and the corresponding lower level serializer unit cell communicates to the corresponding serializer unit cell when the corresponding lower level serializer unit cell is done outputting data.

20 Claims, 10 Drawing Sheets

| Input / State | | | | | | Output / Next State | | | | | | STEP |
|---|---|---|---|---|---|---|---|---|---|---|---|---|
| CLK[1] | RST/GO[1] | DU[1] | DL[1] | MP[1] | DN[1] | CU[1,2] | CL[1,2] | MP[1] | DN[1] | GU[1,4] | GL[1,4] | |
| ↑ | 1 | D/C | D/C | D/C | D/C | CLK | 1 | 0 | 0 | 1 | DU·(MP==1) | (1) |
| ↑ | 0 | 0 | D/C | 0 | 0 | CLK+DU | 1 | 1 | 0 | 0 | DU·(MP==1) | (2) |
| ↑ | 0 | 0 | D/C | 1 | 0 | CLK+DU | 1 | 1 | 0 | 0 | DU·(MP==1) | (3) |
| ↑ | 0 | 1 | D/C | 1 | 0 | CLK+DU | CLK | 2 | 0 | 0 | DU·(MP==1) | (4) |
| ↑ | 0 | 0 | 0 | 2 | 0 | CLK+DU | CLK+DL | 2 | 0 | 0 | DU·(MP==1) | (5) |
| ↑ | 0 | 0 | 1 | 2 | 0 | CLK+DU | CLK+DL | 3 | 0 | 0 | DU·(MP==1) | (6) |
| ↑ | 0 | 0 | 1 | 3 | 0 | 1 | 1 | 0 | 1 | 0 | DU·(MP==1) | (7) |
| ↑ | 0 | D/C | D/C | D/C | 1 | 1 | 1 | 0 | 1 | 0 | DU·(MP==1) | (8) |

Note 1:
Signal mnemonics are as follows:
DU = DONE UPPER, DL = DONE LOWER, GO = GO/RST, CU=CLOCK UPPER, CL=CLOCK LOWER, MP=MUX POSITION, DN=DONE, CLK=VCO Clock, '+' is logical "OR", '·' is logical "AND"

Note 2:
CU and CL signals are gated clock (CLK) signal

Note 3:
The state machine is intended for implementation with a 2-bit counter to keep track of the MUX and 1 flip-flop for "DONE" state; DONE is issued 1 clock cycle after MP advances to 3. All remaining signals can be generated with simple logic gates.

Note 4:
GL is 0 for all steps until DONE UPPER is issued for lower-level cell. It is set for 1 clock cycle (after MP advances to 2, it is cleared). GU is set immediately following RST, but must be cleared on the next clock. To save a flip-flop in the current cell, MUX state of the child cell connected to upper flip flop can be used with an AND gate:
GU = (($MP_{current\ cell}$ == 1)·($MP_{upper\ child\ cell}$ == 0))

FIG. 5

| Input / State | | | | | | | | | Output / Next State | | | | | |
|---|---|---|---|---|---|---|---|---|---|---|---|---|---|---|
| CLK | GO | (DU XOR GU)[1] | (DL XOR GL)[1] | DMP | DN | CT[3] | CU[3] | CL[3] | CB[3] | DMP | DN | GU | GL | STEP |
| ↑ | 1 | D/C | D/C | D/C | D/C | CLK | 1 | 1 | 1 | 0 | DL·(MP=2) | DU·(MP=1) | DU·(MP=2) | (1) |
| ↑ | 0 | D/C | D/C | 0 | 0 | 1 | CLK | 1 | 1 | 1 | DL·(MP=2) | DU·(MP=1) | DU·(MP=2) | (2) |
| ↑ | 0 | 0 | D/C | 1 | 0 | 1 | CLK | 1 | 1 | 1 | DL·(MP=2) | DU·(MP=1) | DU·(MP=2) | (3) |
| ↑ | 0 | 1 | D/C | 1 | 0 | 1 | 1 | CLK | 1 | 2 | DL·(MP=2) | DU·(MP=1) | DU·(MP=2) | (4) |
| ↑ | 0 | D/C | D/C | 2 | 0 | 1 | 1 | CLK | 1 | 2 | DL·(MP=2) | DU·(MP=1) | DU·(MP=2) | (5) |
| ↑ | 0 | D/C | 0 | 2 | 0 | 1 | 1 | 1 | CLK | 3 | 1 | DU·(MP=1) | DU·(MP=2) | (6) |
| ↑ | 0 | D/C | 1 | 2 | 1 | 1 | 1 | 1 | 1 | 0 | 1 | DU·(MP=1) | DU·(MP=2) | (7) |
| ↑ | 0 | D/C | D/C | 3 | 1 | 1 | 1 | 1 | 1 | 0 | 1 | DU·(MP=1) | DU·(MP=2) | (8) |

NOTE 1:
In steps 4 and 6 of the waveform, issuance of a "DONE" signal by a child unit cell is supposed to cause DEMUX position to transition to the next one (at step 4 rising edge of the clock changes DMP from 1 to 2, and at step 6 rising edge of the clock changes DMP from 2 to 3). However since DONE signal from child cells is 1 until GO/RST signal is issued, the DU/DL cannot be used directly. Rather (DU XOR GU) and (DL XOR DL) indicate to the state machine that it is time to move DEMUX position, i.e. move DU only when DU is set AND child cell had been reset on the current deserializer frame. Care may be needed in implementation to ensure that at link startup, DN signals of all unit cells initialize properly (i.e., set to 1 prior to start of the frame)

NOTE 2:
Signal mnemonics are as follows: DU=DONE UPPER, DL=DONE LOWER, GO=GO/RST, CT=CLOCK TOP, CU=CLOCK UPPER, CL=CLOCK LOWER, CB=CLOCK BOTTOM
DMP=DEMUX POSITION, DN=DONE, CLK = recovered bit clock, '·' is logical "AND"

NOTE 3:
CT, CU, CL, CB signals are gated clock (CLK) for unit cell flip flops; CLK is recovered from the data stream

RECURSIVE SERIALIZERS AND DESERIALIZERS

GOVERNMENT RIGHTS

This invention was made with Government support under HR001117C0089 awarded by the Defense Advanced Research Projects Agency. The Government has certain rights in this invention.

FIELD OF EMBODIMENTS OF THE DISCLOSURE

Embodiments of the present disclosure generally relate to methods and systems for serializing and/or deserializing in connection with high speed communications.

BACKGROUND OF THE DISCLOSURE

Certain conventional serializer and deserializer structures utilize a clocked tree approach, with clock speed doubled in each tree level. Accordingly, in a conventional serializer, a first tree level clocks data in a frame rate, and serializes it to 2 times the rate. The next level clocks in data at twice the frame clock, and serializes to 4 times the frame clock using double the clock level of the previous level, and so on, until a final rate is equal to a serializer/deserializer clock rate. Such an approach has various drawbacks. For example, it takes approximately 1 frame cycle (for relatively deep trees) to get a first bit out of the serializer onto the transmission medium, and it takes another frame cycle to get the bit from the transmission medium to the deserializer output. As another example, the serializer tree is limited to $2^N$ size (where N is an integer). As one more example, an entire frame to be serialized has to be clocked in to the serializer at the same time.

SUMMARY OF THE DISCLOSURE

A need exists for improved serialization and deserialization.

With those needs in mind, certain embodiments of the present disclosure provide improved serialization and deserialization of data. In various embodiments, a serializer includes a recursive tree of serializer unit cells. Each serializer unit cell includes a multiplexer, a plurality of flip-flops coupled to the multiplexer, and a state machine. The state machine defines operation of the corresponding serializer unit cell. The recursive tree is organized with upper level serializer unit cells disposed more closely to a serializer output than are lower level serializer unit cells. The recursive tree is configured such that each serializer unit cell that is adjacent to and in an upper position relative to a corresponding lower level serializer unit cell directs the corresponding lower level serializer unit cell to output data, and the corresponding lower level serializer unit cell communicates to the corresponding serializer unit cell when the corresponding lower level serializer unit cell is done outputting data.

Certain embodiments of the present disclosure provide a deserializer that includes a recursive tree of deserializer unit cells. Each deserializer unit cell comprises a demultiplexer, a plurality of flip-flops coupled to the demultiplexer, and a state machine. The state machine defines operation of the corresponding deserializer unit cell. The recursive tree is organized with lower level deserializer unit cells disposed more closely to deserializer output registers of a serializer/deserializer link than are upper level deserializer unit cells. The recursive tree is configured such that each deserializer unit cell that is adjacent to and in an upper position relative to a corresponding lower level deserializer unit cell directs the corresponding lower level cell to deserialize data, and the corresponding lower level unit deserializer cell communicates to the corresponding upper level deserializer unit cell when the corresponding lower level unit cell is done deserializing data.

Certain embodiments of the present disclosure provide a serializer/deserializer system that includes a first serializer, a second serializer, a first deserializer, a second deserializer, and a serializer/deserializer link and associated analog electronics. The first serializer and second serializer each include a recursive tree of serializer unit cells, wherein each serializer unit cell includes a multiplexer, a plurality of flip-flops coupled to the multiplexer, and a state machine. The state machine defines operation of the corresponding serializer unit cell. The recursive tree is organized with upper level serializer unit cells disposed more closely to a serializer output than are lower level serializer unit cells. The recursive tree is configured such that each serializer unit cell that is adjacent to and in an upper position relative to a corresponding lower level serializer unit cell directs the corresponding lower level serializer unit cell to output data, and the corresponding lower level serializer unit cell communicates to the corresponding serializer unit cell when the corresponding lower level serializer unit cell is done outputting data. The second deserializer is coupled to the first serializer via the serializer/deserializer link and configured to receive serialized data from the first serializer via the serializer/deserializer link. The first deserializer is coupled to the second serializer via the serializer/deserializer link and configured to receive serialized data from the second serializer via the serializer/deserializer link. The first deserializer and the second deserializer each include a recursive tree of deserializer unit cells. Each deserializer unit cell includes a demultiplexer, a plurality of flip-flops coupled to the demultiplexer, and a state machine. The state machine defines operation of the corresponding deserializer unit cell. The recursive tree is organized with lower level deserializer unit cells disposed more closely to an output register of the serializer/deserializer link than are upper level deserializer unit cells. The recursive tree is configured such that each deserializer unit cell that is adjacent to and in an upper position relative to a corresponding lower level deserializer unit cell directs the corresponding lower level cell to deserialize data, and the corresponding lower level unit deserializer cell communicates to the corresponding deserializer unit cell when the corresponding lower level unit cell is done deserializing data. The first serializer is positioned on a first side of the serializer/deserializer link with the first deserializer, and the second serializer is positioned on a second side of the serializer/deserializer link with the second deserializer.

BRIEF DESCRIPTION OF THE DRAWINGS

FIG. 5 provides a transition table for the serializer unit cell state machine of FIGS. 3 and 4.

FIG. 8 provides a transition table for the deserializer unit cell state machine of FIGS. 6 and 7.

DETAILED DESCRIPTION OF THE DISCLOSURE

The foregoing summary, as well as the following detailed description of certain embodiments will be better understood when read in conjunction with the appended drawings. As used herein, an element or step recited in the singular and preceded by the word "a" or "an" should be understood as not necessarily excluding the plural of the elements or steps. Further, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional elements not having that property.

Certain embodiments of the present disclosure provide improved serializers and/or deserializers. Various embodiments provide low or reduced latency. For example, for full frames, latency may be reduced to about one ("1") frame cycle (e.g., all data appears at a deserializer output 1 frame cycle after it shows up at a corresponding serializer). For individual bits, latency may be as low as a serializer/deserializer clock cycle (e.g., frame cycle divided by frame size). Additionally or alternatively, various embodiments provide increased flexibility of frame size. Further, various embodiments provide for simple operation and implementation.

Figure 1:
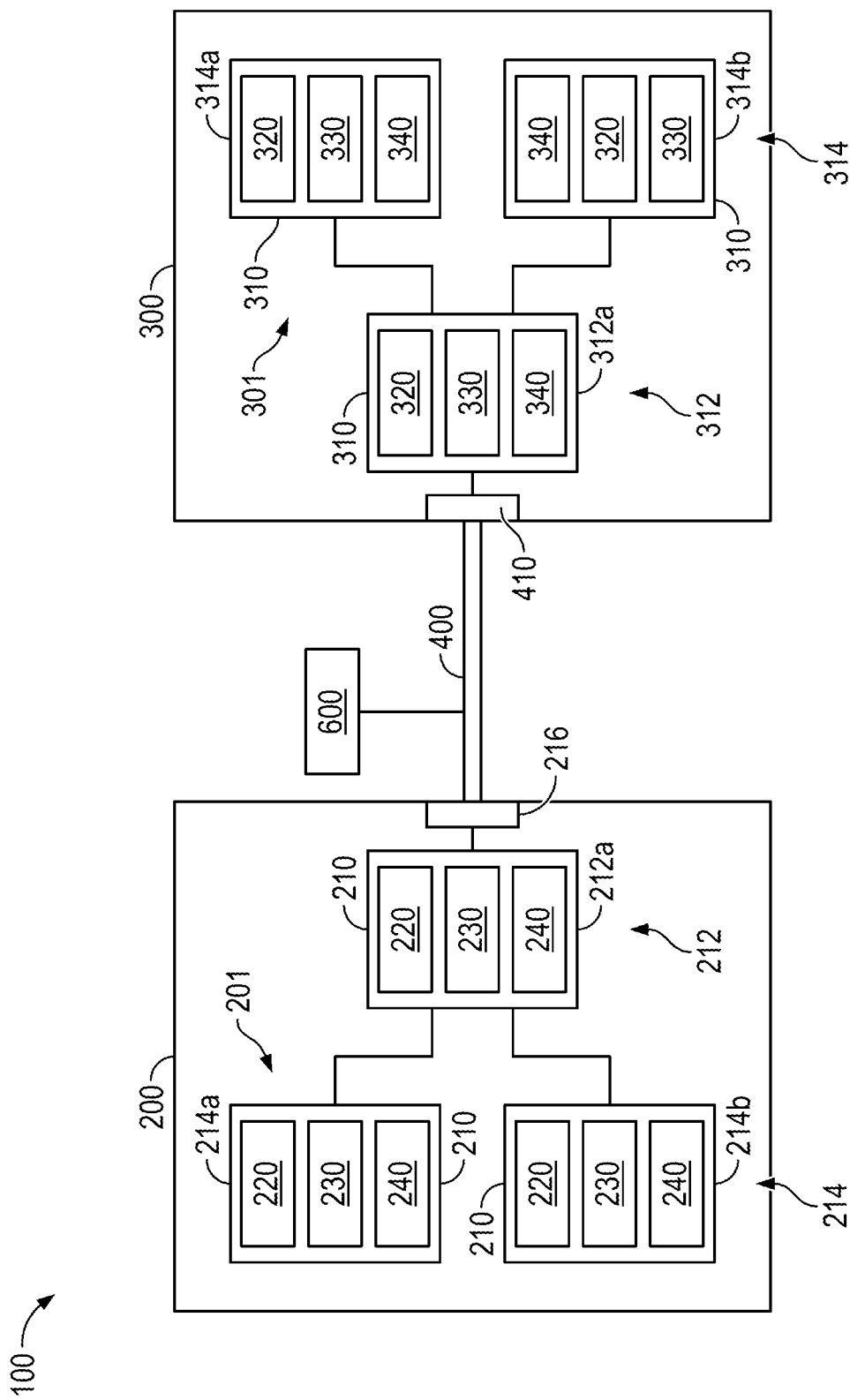
FIG. 1 is a schematic block diagram of a serializer/deserializer system, according to an embodiment of the present disclosure.

FIG. 1 provides a schematic block diagram of a serializer/deserializer system 100, in accordance with various embodiments. The serializer/deserializer system 100 includes a serializer 200, a deserializer 300, and a serializer/deserializer link 400. The serializer 200 and deserializer 300 are coupled by the serializer/deserializer link 400. Generally, the serializer 200 receives data to be transferred to the deserializer 300, and serializes the data for transmission over the serializer/deserializer link 400 to the deserializer 300, which deserializes the data for use by one or more other components. The serializer/deserializer link 400 block illustrated in FIG. 1 may also be understood as including a link medium and associated electronics (e.g., analog electronics). The link medium is a transmission line and link electronics generate and decode voltages on that transmission line from/to logic levels. The system 100 also includes a link initialization unit 600 that is coupled to the serializer 200 and the deserializer 300 via the serializer/deserializer link 400.

The depicted serializer 200 includes a recursive tree 201 of serializer unit cells 210. Each serializer unit cell includes a multiplexer 220 and a plurality of flip-flops 230 coupled to the multiplexer 220. Each serializer unit cell 210 contains a state machine 240 (see, e.g., FIGS. 3-5 and related discussion) that defines the operation of the corresponding serializer unit cell 210.

Figure 2:
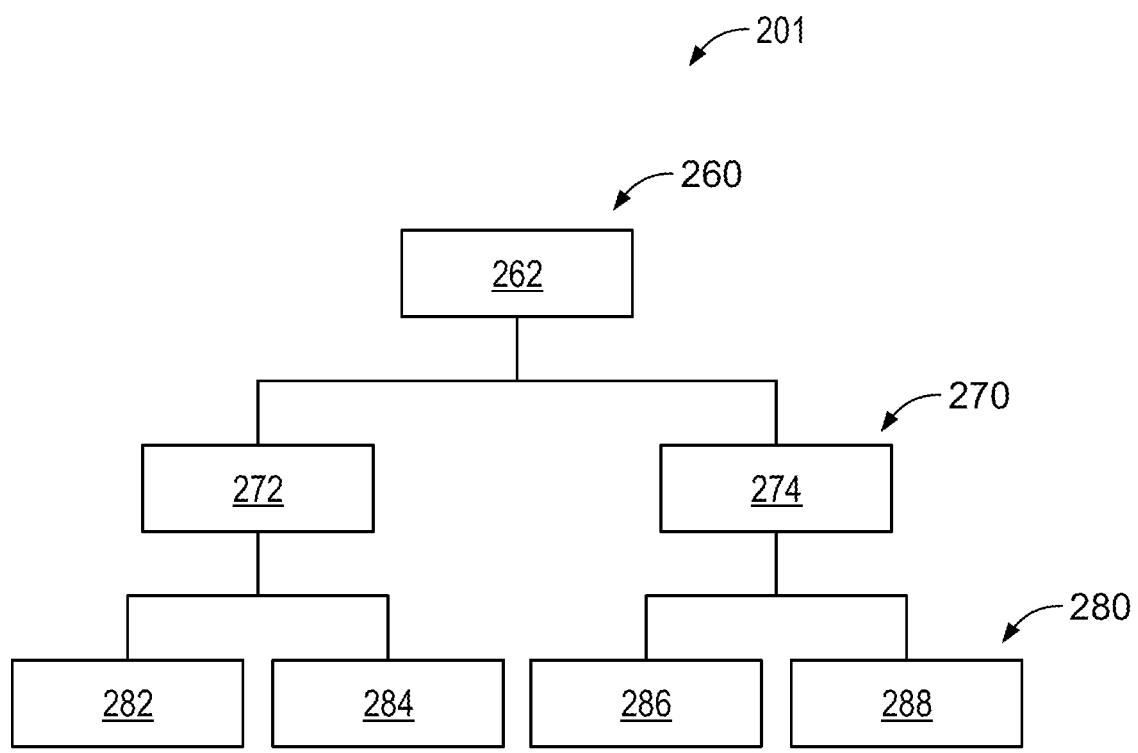
FIG. 2 depicts a schematic block view of a tree having three levels, according to an embodiment of the present disclosure.

The recursive tree 201 is organized with one or more upper (or parent) level unit cells 212 disposed more closely to a serializer output 216 than are lower (or child) level unit cells 214. It may be noted that in the example of FIG. 1, only a single upper level unit cell 212 and a single level of lower level unit cells 214 are shown for clarity and ease of illustration; however, additional levels may be utilized in various embodiments, and/or other numbers of children per parent may be utilized in various embodiments. It may further be noted that the terms "upper" and "lower" in connection with different levels of cells are used relatively, and that a cell that is an upper level unit cell with respect to a given cell may be a lower level unit cell with respect to a different cell. For example, FIG. 2 depicts an example recursive tree 201 having a first level 260, a second level 270, and a third level 280. The first level 260 is upper relative to the second level 270, and the second level 270 is upper relative to the third level 280. It may further be noted that a first cell that is upper with respect to a second cell may also be referred to as a parent of the second cell, and the second cell (the lower cell in the tree) may be referred to as a child of the first cell (the upper cell in the tree).

With continued reference to FIG. 1, the recursive tree 201 is configured such that each serializer unit cell (e.g., 212a) that is adjacent to and in an upper position relative to a corresponding lower neighbor serializer unit cell (e.g., 214a, 214b) directs the lower neighbor serializer unit cell to output data (e.g., to the upper neighbor serializer unit cell). Also, the corresponding lower neighbor serializer unit cell communicates to the corresponding serializer unit cell (e.g., upper neighboring cell) when the corresponding lower neighbor serializer unit cell is done outputting data. Responsive to the communication that the lower neighbor serializer unit cell is done outputting data, the upper neighbor serializer unit cell may direct an additional lower neighbor serializer unit cell to output data, or, if there are no remaining lower cells associated with the upper cell, the upper cell may communicate that its subtree (214a, 214b and their children) have output all data to a cell that is upper relative to it, until the uppermost cell has output all the data in the entire tree for the serializer frame. As used herein, a "frame" has all the input bits contained at the lowest level of the serializer tree that are to be transmitted, or, for a deserializer, all of the bits contained at the lowest level of all bits that are to be received.

Accordingly, in the example of FIG. 1, the upper serializer unit cell 212a may direct lower neighbor serializer unit cell 214a to output data, and lower neighbor serializer unit cell 214a may inform upper serializer unit cell 212a when it is done outputting data. Responsive to that communication, the upper serializer unit cell 212a may then direct lower neighbor serializer cell 214b to output data.

Similarly, in the example of FIG. 2, cell 262 of upper level may be understood as upper relative to cells 272 and 274 of second level 270, and may receive communications from cells 272, 274. Further, cells 272, 274 from second level 270 may be considered upper to cells 282, 284, 286, 288 of third level 280, with cell 272 a neighboring upper cell to cells 282, 284, and cell 274 a neighboring upper cell to cells 286, 288. As such, cell 272 may receive communications from cells 282, 284. Similarly, cell 274 may receive communications from cells 286, 288. Each unit cell that is upper to other unit cells may be understood as defining a subtree containing those lower level unit cells. For example, subtree of cell 262 contains all unit cells in the diagram. All data for a given unit cell may be understood as having been transferred when all data of the subtree of that unit cell, with the unit cell itself at the top, has been serialized and output to the parent cell. It may be noted that the arrangement of FIG. 2 is provided by way of example for illustrative purposes, and that other arrangements (e.g., additional children (or lower cells) per parent (or upper cells), and/or additional sources of data to parent cells) may be utilized in other embodiments.

It may be noted that in various embodiments, each serializer unit cell operates to output data until all bits for that serializer unit cell subtree are exhausted, and an immediately adjacent upper serializer unit cell begins outputting data responsive to exhaustion of all bits for one or more immediately adjacent lower serializer unit cells. For example, for the example tree of FIG. 2, cell 282 may output all of its bits to cell 272 (which is the immediately adjacent upper cell relative to cell 282), and cell 284 may output all of its bits to cell 272. For example, responsive to a communication from cell 284 that its bits are exhausted, cell 272 may communicate to cell 262 that its subtree serialized all bits and it is done for this frame, and cell 262 may communicate a command to cell 274 to begin outputting its data through cell 262. It may be noted that no data may be stored in cells past a flip-flop being clocked to capture all data from a given subtree (or subtrees). Instead, the flip-flop captures a bit and outputs the bit on the next clock cycle to the parent cell through a multiplexer.

In some embodiments, each upper serializer unit cell is coupled to a first lower serializer unit cell and a second lower serializer unit cell. For instance, in the example of FIG. 1, cell 212*a* (an upper serializer unit cell) is coupled to cell 214*a* (a first lower serializer unit cell) and cell 214*b* (a second lower serializer unit cell). Similarly, in the example of FIG. 2, cell 262 (an upper serializer unit cell) is coupled to cell 272 (a first lower serializer unit cell) and cell 274 (a second lower serializer unit cell); cell 272 (an upper serializer unit cell) is coupled to cell 282 (a first lower serializer unit cell) and cell 284 (a second lower serializer unit cell); and cell 274 (an upper serializer unit cell) is coupled to cell 286 (a first lower serializer unit cell) and cell 288 (a second lower serializer unit cell). Further, the upper serializer unit cell in various embodiments is configured to direct the first lower serializer unit cell to serialize data, and to direct the second lower serializer unit cell to serialize data responsive to completion of serialization by the first lower unit cell.

Figure 3:
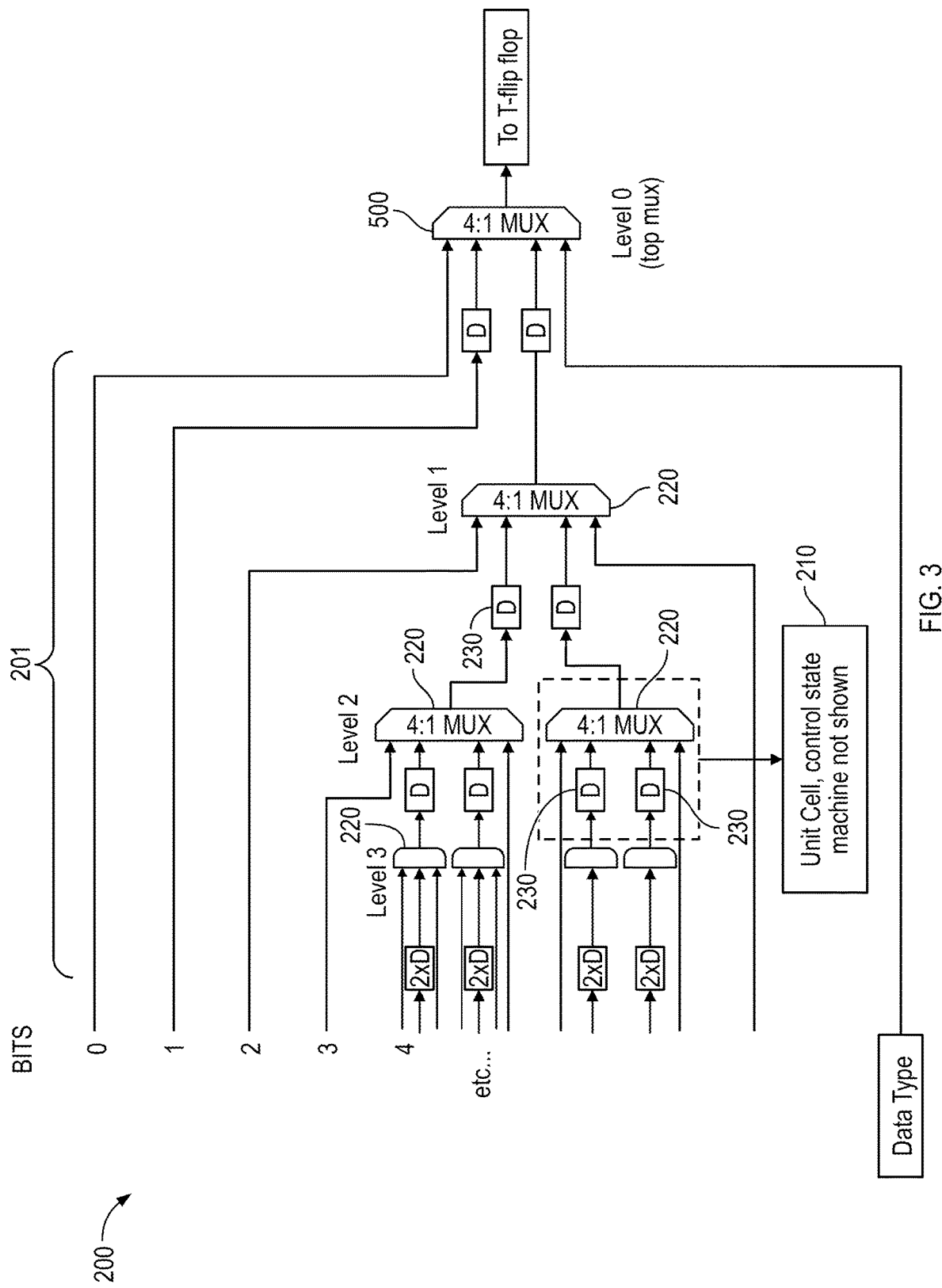
FIG. 3 depicts a schematic block view of a serializer tree, according to an embodiment of the present disclosure.

FIG. 3 provides a schematic block view of an example serializer 200 including a serializer tree 201. In various embodiments, the tree 201 is optimized for low latency. The depicted tree 201 of FIG. 3 includes multiplexers 220 that are configured as 4:1 multiplexers. The tree 201 in the illustrated example also includes flip-flops 230 (also labeled D in FIG. 3). The tree 201 is organized by serializer unit cells 210 that include associated state machines 240 (see FIGS. 4 and 5 and related discussion). The serializer 200 and serializer tree 201 may be understood as being recursive because all units cells are identical down to lowest (terminating) unit cells which contain a terminating condition, and upper unit cells command lower unit cells to output data in identical manner to lower unit cells commanding their children, while the lower unit cells of the serializer tree indicate to upper unit cells when the lower unit cells are done outputting data in the same manner that upper unit cells indicate to their parents that their subtrees have been serialized. In the illustrated example, unit cells in "Level 2" are upper to those in "Level 3," and the unit cell in "Level 1" is upper to those in "Level 2." In various embodiments, "done" signals are generated at the lowest levels and propagate up. A terminating condition may be provided for a serializer unit cell when an upper or lower level flip-flop of the cell samples an input frame directly, and may be indicated by outputting a "DONE" signal.

It may be noted that the number of bits that the serializer can accommodate depends on the number of levels. In the example shown in FIG. 3, with 3 levels (not counting a multiplexer 500 in top "Level 0" as a level), 24-bit frames plus data type bit are supported. As another example, with 4 levels, 48-bit frames plus data type bit may be supported. It should be noted that the above examples are provided by way of example and not limitation, and that other numbers of levels or bit frames may be utilized in various embodiments. It may be noted that FIG. 3 also shows a "DATA TYPE" bit. The "DATA TYPE" bit may identify streaming or transactional operation, and is discussed in more detail later in this document.

Figure 4:
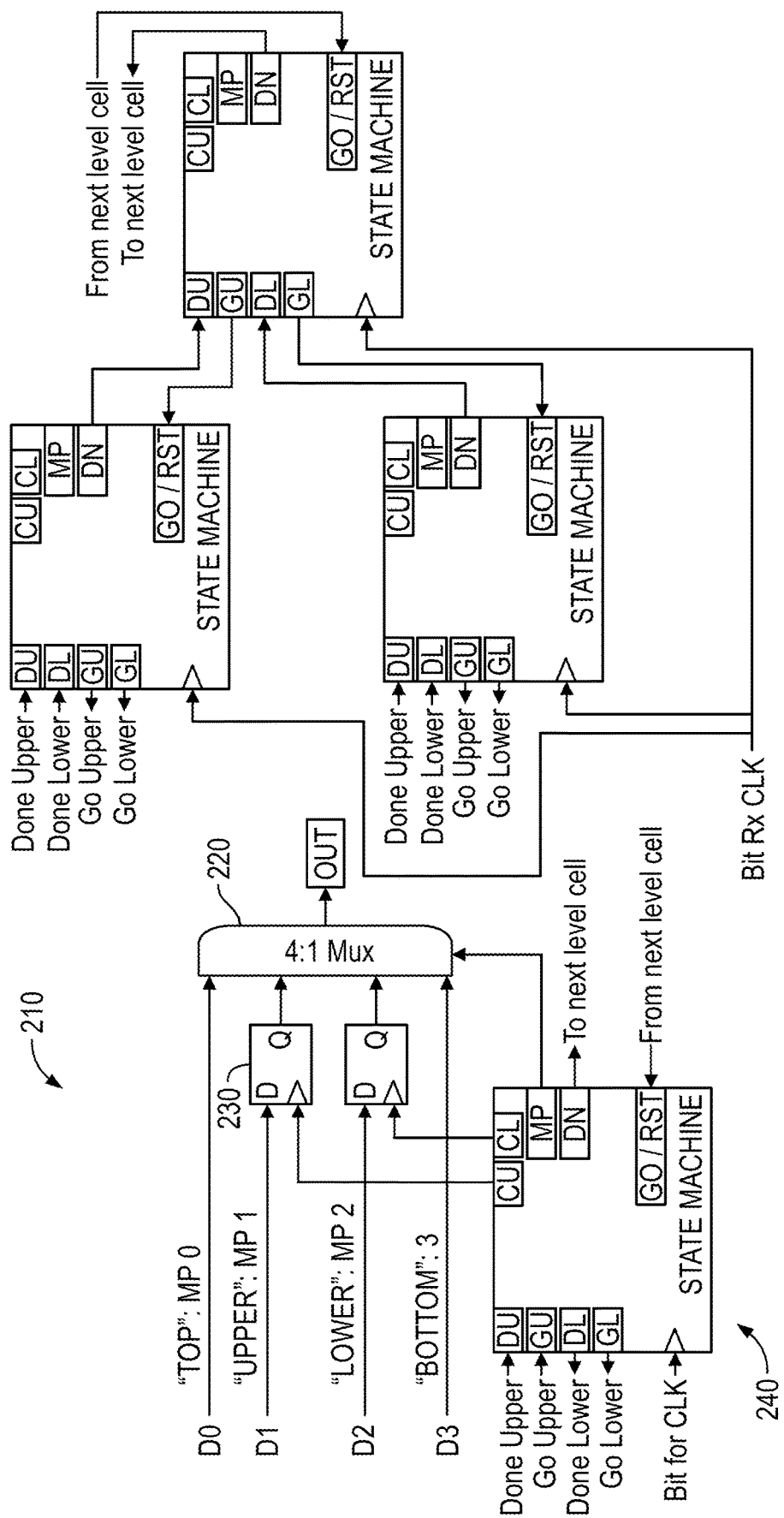
FIG. 4 depicts a schematic block view of a serializer unit cell and state machine connections, according to an embodiment of the present disclosure.

FIG. 4 provides a schematic block view of a serializer unit cell 210 and associated state machine 240 in accordance with various embodiments. FIG. 4 also depicts certain interconnects between state machines at different levels. With continued reference to FIG. 4, the operation of an example serializer 200 will next be discussed.

The parent state machines (those closer to the output) generate "GO" signals to state machines of their nearest child level (e.g., the state machines of the unit cells immediately beneath and associated with the particular state machine). It may be noted that the top and bottom flip-flop connection of each unit cell is to the data bus input frame. Once the top level bit corresponding to "DO" in FIG. 4 is passed on to the parent cell through the multiplexer 220, a "GO UPPER" signal is issued to the child level connected to the upper flip-flop, the multiplexer 220 is positioned to port 1, and the upper flip-flop is clocked using a gated clock signal (which may be referred to as "CU" herein). It may be noted that the use of "upper" and "lower" here in connection with the positions of children of the same level with respect to each other, or the positions of flip-flops of the same level with respect to each other, does not relate to different levels of the tree but instead to orders of processes performed or order of connection to another component within the unit cell being described (e.g., ports of a multiplexer).

Then, once all data in the subtree connected to the upper flip-flop is serialized, a "GO" signal is provided to the child connected to the lower flip-flop, the multiplexer 220 is positioned to port 2, and the lower flip-flop is clocked using a gated clock signal (which may be referred to as "CL" herein). Once all data is serialized in the subtree connected to the lower flip-flop, the multiplexer 220 is moved port 3, and the state machine 240 issues a "DONE" signal to its parent. Responsive to the "DONE" signal, the parent proceeds to issue a GO signal to its next child, or, if the current child is the last one, proceeds to serialize its last bit and issue a "DONE" signal to its parent.

It may be noted that "DONE UPPER" and "DONE LOWER" signals are generated by the children connected to upper and lower flip flops of a given unit cell. At the lowest level unit cells, in which one or both unit cell flip-flops (depending on tree geometry) are connected directly to the input frame and do not have child subtrees, a special condition, herein referred to as "state machine termination" generates the "DONE UPPER" and "DONE LOWER"

signals to enable the lowest level unit cells to operate properly. The "DONE UPPER" or "DONE LOWER" signals in the state machine termination are generated at the same time as the upper or lower flip flops, respectively, clock their bit directly from the input frame. These signals are thus propagated to higher levels of the serializer tree as "DONE" signals, which are shown as "DN" in FIG. 5, which is a transition table for an example serializer state machine (e.g., the serializer state machine corresponding to FIG. 4). It may further be noted data availability at the serializer input in various embodiments results in transmit latency of one ("1") serializer clock cycle for the first bit plus delay of the Tx cell, with data received at the destination after transmission line delay of the medium into a similarly structured deserializer. It may be noted that two clocks are utilized in various embodiments. A frame clock may be used as a lower speed clock at which a chip processes data, and a serializer clock used for data transfer, which in various embodiments is substantially faster than an on-chip logic clock, and in the following is referred to as "VCO Clock."

With reference to FIG. 5, the "DN" (or DONE) signal of a child cell connects to the higher level unit cell state machine "DU" (DONE UPPER) or "DL" (DONE LOWER) input, depending on which multiplexer port it corresponds to.

Figure 10:
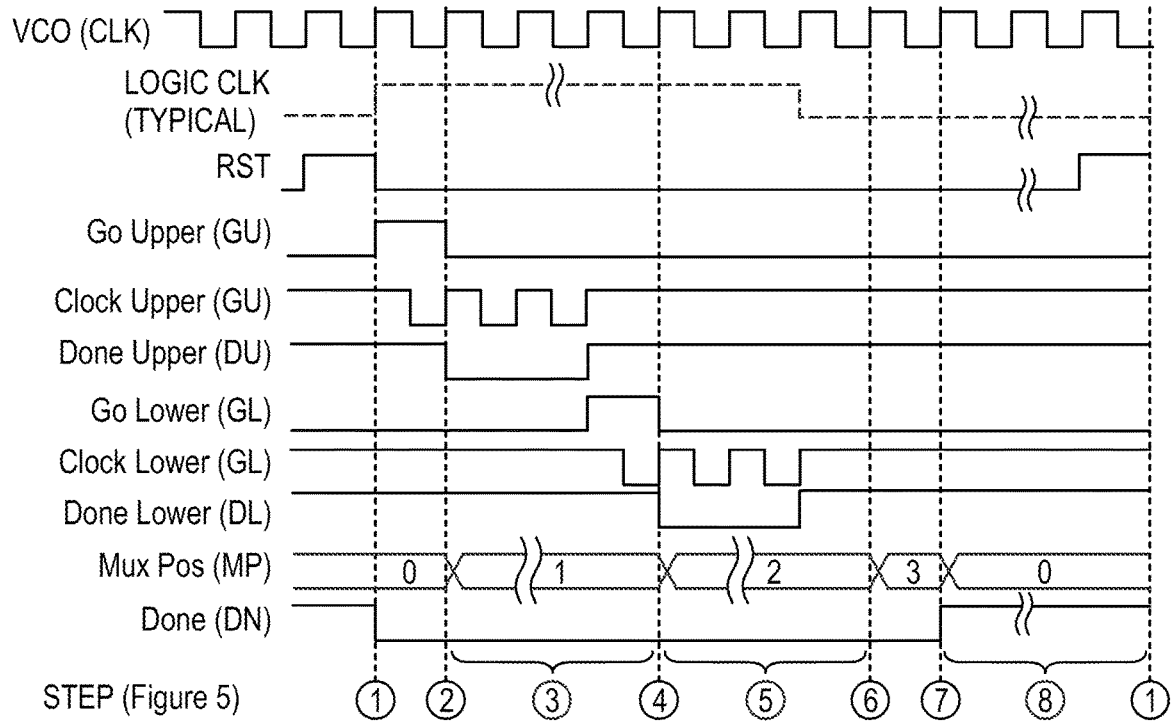
FIG. 10 provides an example of a serializer waveform, in accordance with the transition table of FIG. 5.

With continued reference to FIG. 5, at step 1, a "1" present on GO/RST causes all states to reset on the next clock rising edge. CU and CL are 1 at the time reset is issued (CLK is not transferred to them) and unit cell flip-flops are not clocked. VCO CLK is allowed to propagate to CU immediately after VCO CLK edge of step 1, however, due to it being set to 1 prior to reset, it does not affect CU until one half of VCO clock cycle later. The reset input is then cleared on the following rising edge of the VCO clock. It may be noted that, for the top unit cell, this is taken care of by synchronization pulses, whose timing may be established at link initialization which synchronizes serializer and deserializer, and for child unit cells, it is cleared by the state machine at the higher level when a "GO UPPER" or "GO LOWER" signal is issued to them. The multiplexer is set to port 0 immediately after reset. The output of the multiplexer port 0 is clocked into the flip-flop of the next higher level (parent) cell on the following VCO clock edge. It may be noted, in reference to FIG. 3, that a T (toggle) flip-flop is shown at the output of the top level cell. A different type of flip-flop or analog output circuit may be utilized depending on the specific analog signaling scheme chosen, without impacting the generality of this description, and the T flip-flop is only shown as an example. At that time, a GO UPPER signal is issued to enable a lower level cell to initialize. For an example waveform corresponding to the state machine of FIG. 5, see FIG. 10 and related discussion. It should be noted that the particular implementation discussed in connection with FIG. 5 is provided by way of example, and that other implementations may be employed in alternate embodiments.

At step 2 and during interval 3, the multiplexer is advanced to port 1, and while DU is 0, a clock is applied to the upper flip-flop (e.g., CU=CLK). The DU input from the child cell is cleared by the GU (or GO UPPER) signal issued at step 1. Once DU is set to 1 by the upper child cell, CU is inhibited, a clock is applied to the lower flip-flop (CL=CLK), and GL (or GO LOWER) is set to 1 at the same time as DU is asserted while the multiplexer is still at position 1. This causes the unit cell connected to the lower flip-flop to initialize on the next CLK edge. Also at step 2, GU is cleared to keep the upper child cell from resetting. Interval 3 lasts up to one VCO CLK cycle after the DONE UPPER (DU) signal is asserted by the child cell. It may be noted that other timing variations may be used in other embodiments.

At steps 4 and during interval 5, the multiplexer is advanced to port 2, and the clock continues to be applied to the lower flip-flop (e.g., CL=CLK) while DL=0 (i.e., while lower child is not done). GL is cleared at step 4, so that the lower level cell does not keep resetting. Once the DONE LOWER (DL) signal is asserted by the lower child, clocking is inhibited to both flip-flops (e.g., CU=CL=1) on the same clock cycle, and the multiplexer is advanced to port 3 on the VCO CLK cycle following assertion of DL, at step 6.

At step 6 multiplexer is advanced to port 3, and the cell waits for 1 VCO clock cycle to set DN to 1, which enables the higher level unit cell to move on to its next multiplexer position. At step 7 multiplexer transition occurs to port 0, and further operation is inhibited during interval 8, while DN=1 until the next RST is issued. During interval 8, nothing is done until an RST input restarts the state machine.

With continued reference to FIG. 1, the deserializer 300 is coupled to the serializer 200 via the serializer/deserializer link 400, and is configured to receive serialized data from the serializer 200 via the serializer/deserializer link 400. For example, the deserializer 300 may receive information via a bit receiver 410 of the serializer/deserializer link.

The depicted deserializer 300 includes a recursive tree 301 of deserializer unit cells 310. Each deserializer unit cell 310 includes a demultiplexer 320 and a plurality of flip-flops 330 coupled to the demultiplexer 320. Each deserializer unit cell 310 also contains a state machine 340 (see, e.g., FIGS. 6-8 and related discussion) that defines the operation of the corresponding deserializer unit cell 310.

The recursive tree 301 is organized with one or more lower (or child) deserializer unit cells 314 disposed further from the bit receiver 410 than are upper (or parent) deserializer unit cells 312. Bit receiver 410 accepts an analog signal from serializer/deserializer link 400 and converts it into a logic-level digital bit stream at a SerDes clock rate. It may be noted that in the example of FIG. 1, only a single upper deserializer unit cell 312 and a single level of lower deserializer unit cells 314 are shown for clarity and ease of illustration; however, additional levels may be utilized in various embodiments. It may further be noted that the terms "upper" and "lower" are used relatively, and that a cell that is an upper unit cell with respect to a given cell may be a lower unit cell with respect to a different cell. (e.g., generally similar to the 3-level serializer tree depicted and discussed in connection with FIG. 2.)

With continued reference to FIG. 1, the recursive tree 301 is configured such that each deserializer unit cell (e.g., 312a) is adjacent to and in a parent position relative to a corresponding child neighbor deserializer unit cell (e.g., 314a, 314b).

In the example of FIG. 1, the parent deserializer unit cell 312a may direct upper child neighbor deserializer unit cell 314a to deserialize data, and upper child neighbor deserializer unit cell 314a may inform parent serializer unit cell 312a when it is done deserializing data. Responsive to that communication, the parent deserializer unit cell 312a may then direct lower child neighbor deserializer cell 314b to deserialize data.

Similar to the above discussion regarding a serializer tree, the deserializer unit cells may be understood as having subtrees. Each child unit cell and corresponding subtree deserialize data received through a corresponding parent cell.

In some embodiments, each parent deserializer unit cell is coupled to a first child deserializer unit cell and a second child deserializer unit cell. For instance, in the example of FIG. 1, cell 312a (a parent deserializer unit cell) is coupled to cell 314a (a first child deserializer unit cell) and cell 314b (a second child deserializer unit cell). Further, the parent deserializer unit cell in various embodiments is configured to direct the first child deserializer unit cell to deserialize data, and to direct the second child deserializer unit cell to deserialize data responsive to completion of deserialization by the first child deserializer unit cell.

Figure 6:
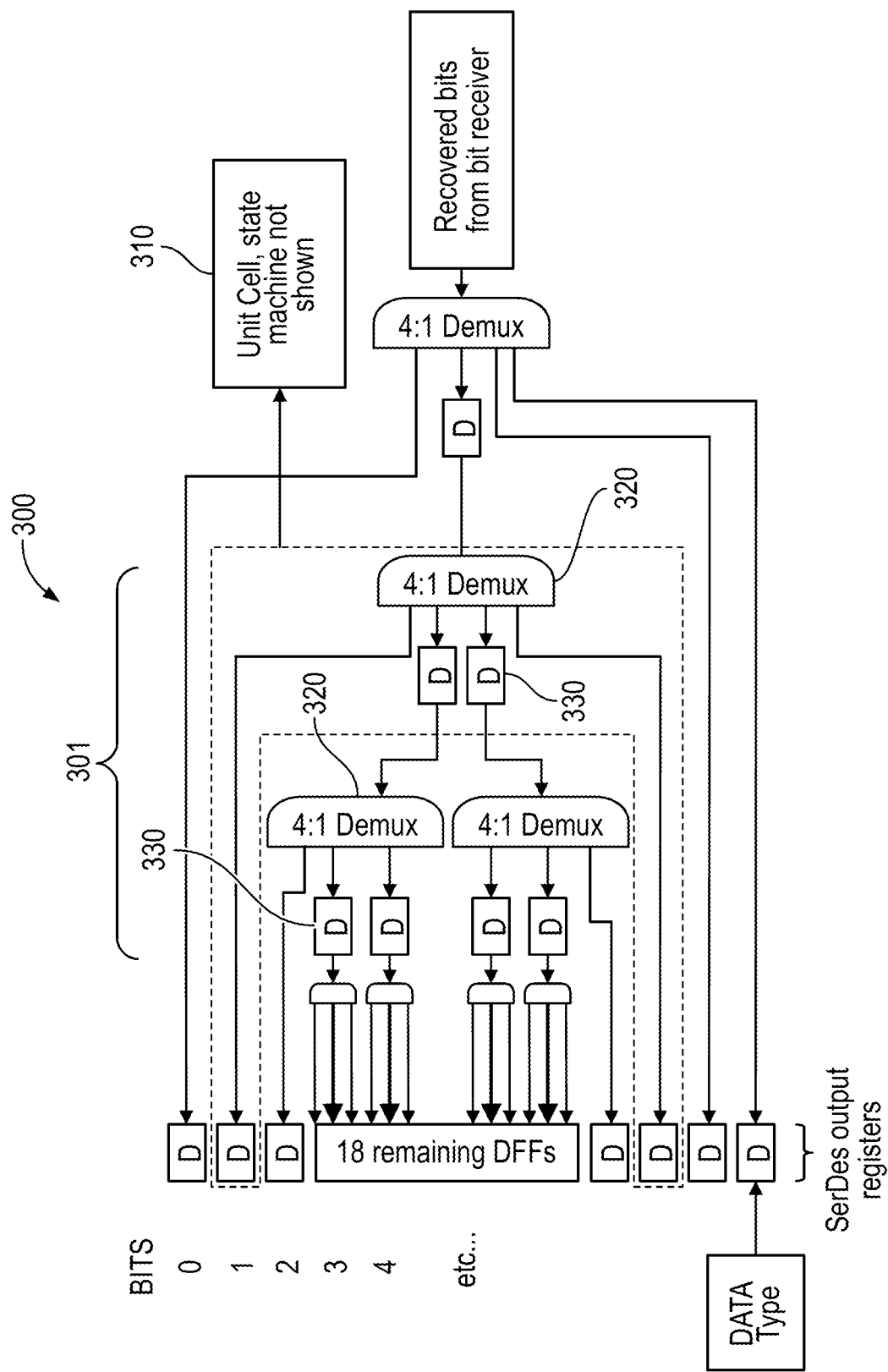
FIG. 6 depicts a schematic block view of a deserializer tree, according to an embodiment of the present disclosure.

FIG. 6 provides a schematic block view of an example deserializer 300 including a deserializer tree 301. It may be noted that the depicted deserializer tree 301 of FIG. 6 is structured similarly to the serializer tree 201 of FIG. 3, but with a different unit cell and slightly different state machine associated with each unit cell. Similar to the serializer tree 201, the deserializer tree 301 operates recursively as discussed herein. It may be noted that the depicted deserializer 300 is shown for a 24-bit frame. A 48-bit frame may be provided by adding an additional level to the deserializer tree 301. It may be noted that the above numbers of levels are provided by way of example and not limitation, and that other configurations may be used in alternate embodiments.

Figure 7:
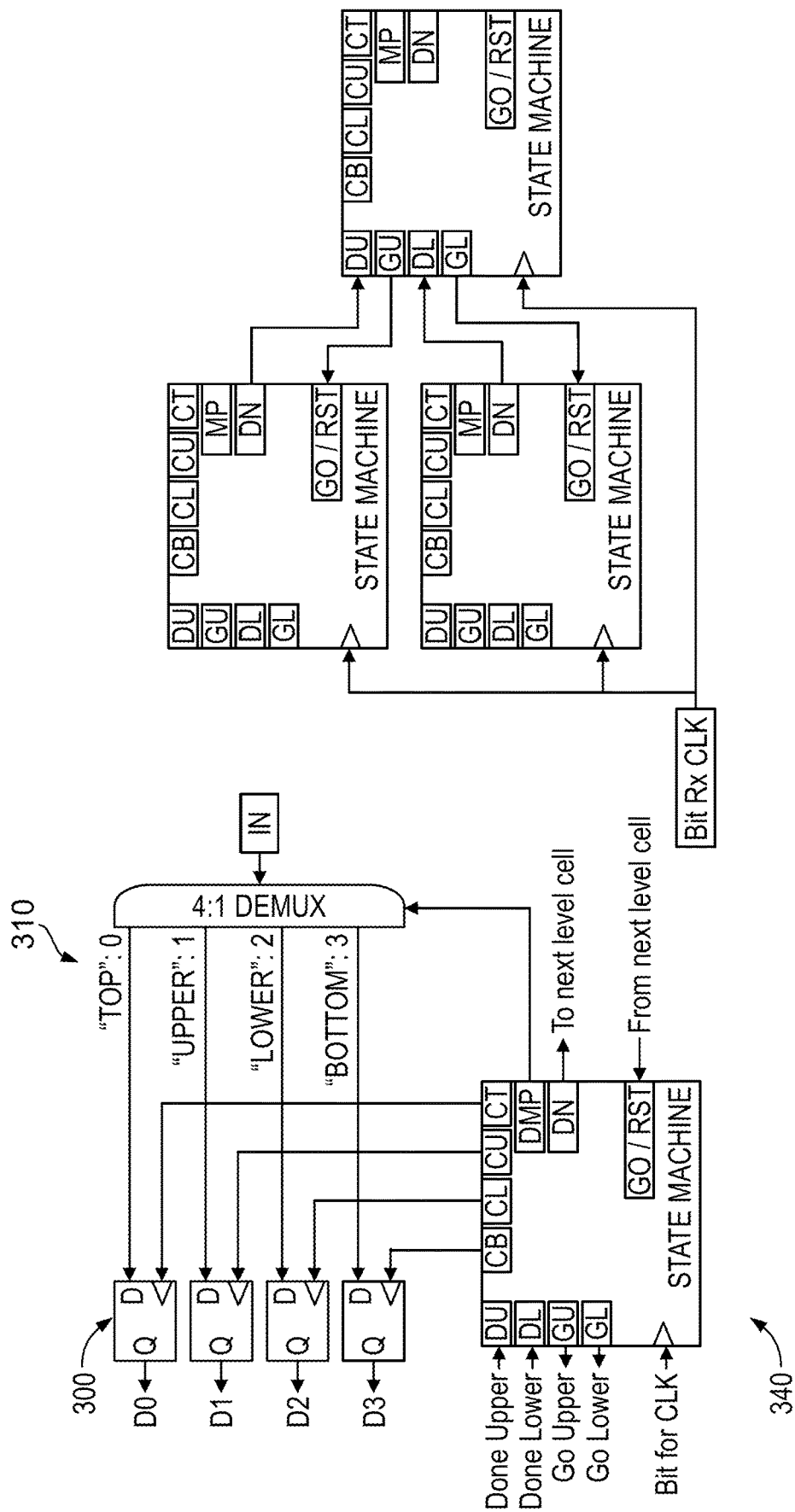
FIG. 7 depicts a schematic block view of a deserializer unit cell and state machine connections, according to an embodiment of the present disclosure.

FIG. 7 provides a schematic block view of a deserializer unit cell 310 and associated state machine 340 in accordance with various embodiments. FIG. 7 also depicts the interconnect between child and parent state machines. As seen in FIGS. 6 and 7, each deserializer unit cell 310 includes 4 flip-flops 330 (labeled D in FIG. 6), a 4:1 demultiplexer 320, and a state machine 340. It may be noted that the lowest level of the flip-flops include deserializer output registers of the serializer/deserializer link. It may be noted that other configurations of multiplexer and demultiplexer (e.g., ratio other than 4:1) may be used in various embodiments.

The deserializer unit cell 310 accepts a recovered clock signal (e.g., from a SerDes clock) from the bit receiver and applies it to "Bit Rx CLK." FIG. 8 provides a transition table for an example deserializer state machine (e.g., the deserializer state machine corresponding to FIGS. 6 and 7).

Figure 11:
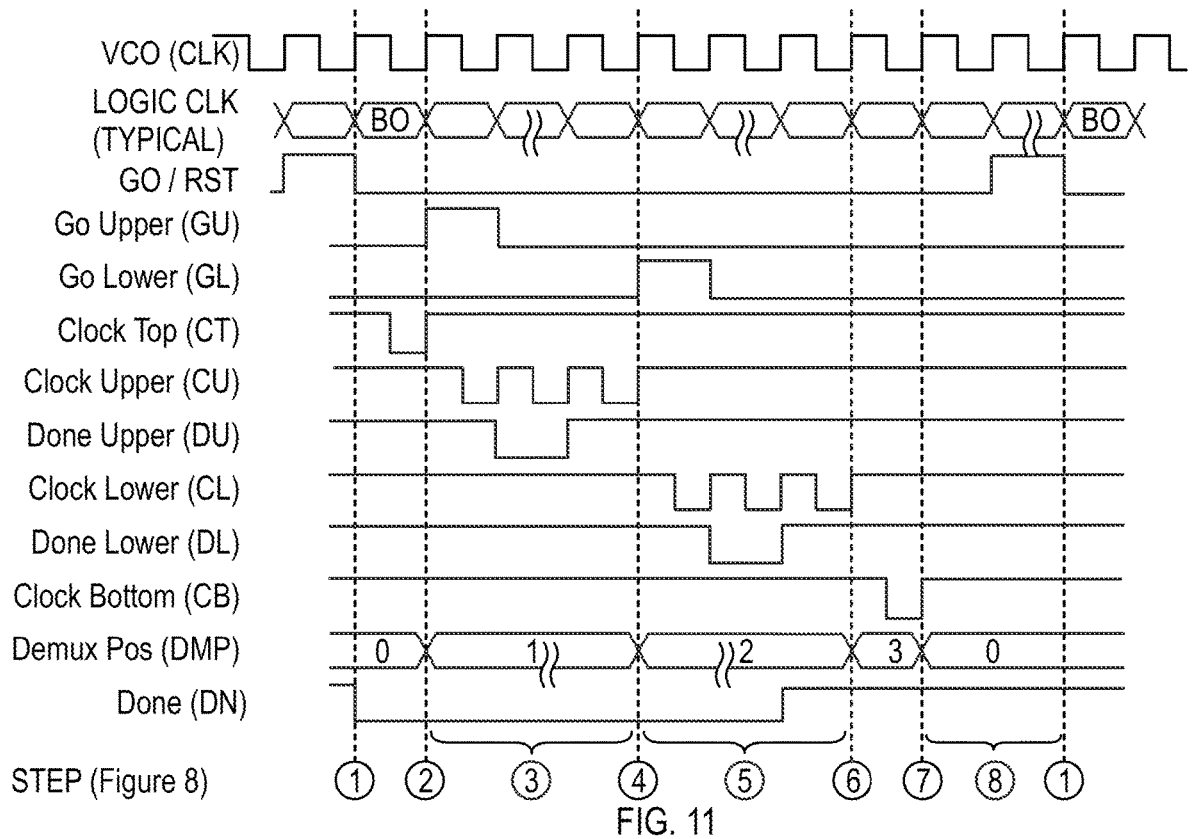
FIG. 11 provides an example of a deserializer waveform, in accordance with the transition table of FIG. 8.

With references to FIG. 8 and FIG. 11, at step 1, a "GO/RST" signal serves as a reset for the state machine. For the top-level unit cell, timing of the GO/RST signal is synchronized to the beginning of a serializer frame on the other side of the link during link initialization. Lower level cells are connected to higher level cells as shown in FIG. 7. The rising edge of the clock after GO/RST enables the CT clock for 1 cycle, thus capturing the first data bit into a deserializer output register belonging to the top level cell. The link is synchronized, so that at the top level, the GO/RST signal is set to "1" one BIT RX CLK cycle prior to the first bit of the serializer frame being present at the top input of the demultiplexer. In various embodiments, this is done at link initialization of a logic clock divider.

At step 2, the demultiplexer is advanced to the next port. During interval 3, a clock is applied at CU until DU (DONE UPPER) is asserted by the child unit cell connected to the upper flip-flop. Then, at step 4, once the DONE UPPER input is received, a GO LOWER (GL) signal is issued to initialize the child unit cell connected to the lower flip-flop on the following cycle, and the demultiplexer port is set to 2.

During interval 5, the lower flip-flop is clocked by applying a clock to CL until the lower level unit cell issues a "DONE" (DN) signal on the DONE LOWER input. Once DONE LOWER is received from the lower child unit cell, DONE is set to 1. Setting DONE to 1 instructs the parent unit cell to capture one more bit, which in turn is captured at step 6.

At step 6, the demultiplexer is advanced to port 3, and a clock is applied to CB for 1 cycle, allowing the last bit to be captured into the deserializer output frame. At step 7, the demultiplexer is set back to port 0 until the GO/RST signal is once again received to restart the deserialization cycle with the next frame. During interval 8, nothing is done until the next GO/RST signal is received.

In some serializer embodiments, cells that contain flip-flops directly connected to an input serializer frame, rather than another child cell, contain recursion termination logic within state machine logic. Recursion termination logic serves to effectively generate a "DONE" signal within the cell itself in the absence of a child cell that would otherwise perform that function. For the state machine shown in FIG. 5, termination in the absence of an upper child cell would be performed by setting the "DU" input to "1" on the first "CU" rising edge after assertion of GO/RST signal to the cell. Termination in the absence of a lower child is performed by setting the "DL" input to "1" on the first "CL" rising edge after assertion of a GO/RST signal to the cell.

In some deserializer embodiments, cells whose DEMUX positions 2 and 3 connect to a deserializer frame, rather than child cells, contain recursion termination logic within state machine logic. Recursion termination logic serves to effectively generate a "DONE" signal within the cell itself in the absence of a child cell that would otherwise perform that function. For the state machine shown in FIG. 8, termination in the absence of an "UPPER" child (DEMUX position 2) is accomplished by forcing (DU XOR GU) signal to "1" when DEMUX position is 1. Termination in the absence of a "LOWER" child (DEMUX position 3) is accomplished by forcing (DL XOR GL) signal to "1" when DEMUX position is 2.

Figure 9:
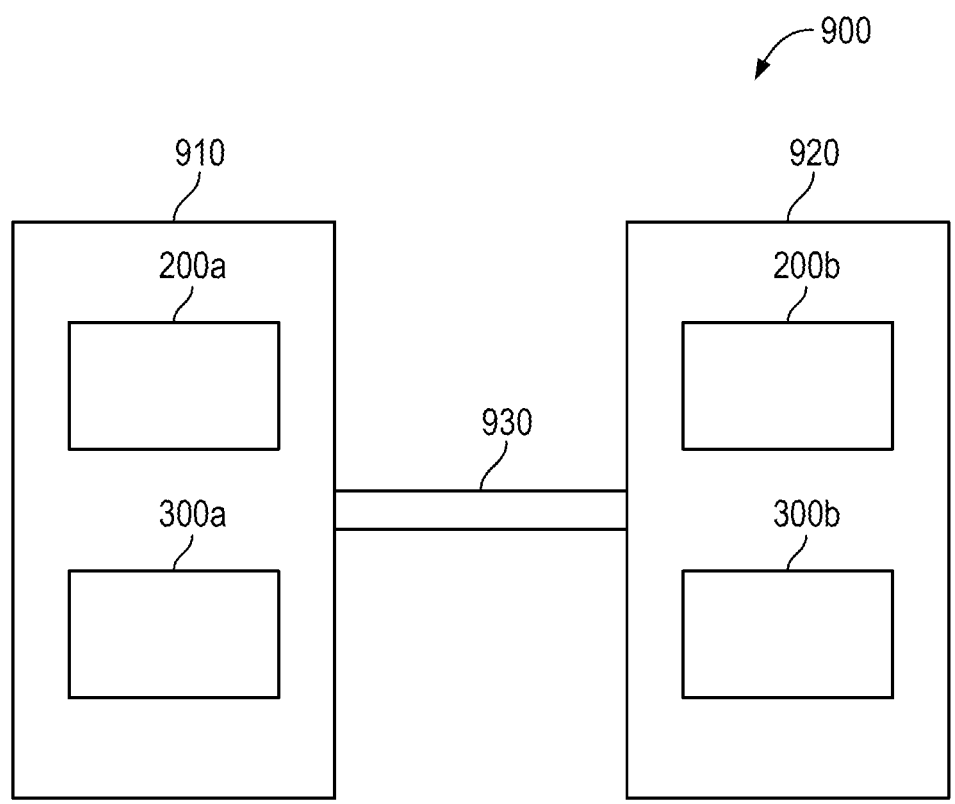
FIG. 9 provides a block view of a system that provides bi-directional serialization and deserialization, according to an embodiment of the present disclosure.

Some embodiments provide for bi-directional serialization and de-serialization, or for serialization and de-serialization on both sides of a link. FIG. 9 provides a block view of a system 900 that provides bi-directional serialization and de-serialization. The system 900 includes a first serializer/deserializer 910 and a second serializer/deserializer 920 coupled by a link 930. Generally, the first serializer/deserializer 910 may be used to deserialize data that is serialized by the second serializer/deserializer 920, and the second serializer/deserializer 920 may be used to deserialize data that is serialized by the first serializer/deserializer 910. The link 930 may incorporate one or more aspects of the serializer/deserializer link 400 discussed herein.

As seen in FIG. 9, the first serializer/deserializer 910 includes a first serializer 200a and a first deserializer 300a. Similarly, the second serializer/deserializer 920 includes a second serializer 200b and a second deserializer 300b. The first serializer 200a and second serializer 200b may be generally similar to the serializer 200 discussed herein. Also, the first deserializer 300a and the second deserializer 300b may be generally similar to the deserializer 300 discussed herein. The first deserializer 300a may be used to de-serialize data that has been serialized by the second serializer 200b and communicated to the first deserializer 300a via the link 930. Similarly, the second deserializer 300b may be used to de-serialize data that has been serialized by the first serializer 200a and communicated to the second deserializer 300b via the link 930. Accordingly, bi-directional (on either side of the link 930) serialization and de-serialization may be achieved by the system 900.

Some embodiments of bidirectional serializer/deserializer link 930 provide for implementation of a "DATA TYPE" bit. This bit is used to identify the type or nature of the data being transferred over each serializer frame. The data type may be "streaming" or "transactional." "Transactional" data type is used to identify link configuration messages, including those that identify data routing within systems containing multiple links 930. "Streaming" data type does not contain link configuration messages, and the data is routed along the path configuration set up by earlier "transactional" data.

It may be noted that in various embodiments, the first bit is valid at the top deserializer output flip-flop approximately 1.5 VCO clock cycles after the data transition edge is received. This sets the total overall delay for individual bit transfer on the link to approximately 2.5 VCO clock cycles plus the analog delay of the interconnecting transmission line, output transmit I/O cell, and receive I/O cell. Overall delay for data frames is equal to one logic clock cycle of the transmit side of the link plus interconnecting transmission line delay.

Accordingly, various embodiments provide reduced latency, and/or increased flexibility of frame size, and/or improved ease of operation and implementation of serializers/deserializers.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein.

It should be noted that the various embodiments may be implemented in hardware, software or a combination thereof. The various embodiments and/or components discussed herein also may be implemented as part of one or more computers or processors. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a solid state drive, optic drive, and the like. The storage device may also be other similar means for loading computer programs or other instructions into the computer or processor.

As used herein, the term "computer," "controller," "system," and "module" may each include any processor-based or microprocessor-based system including systems using microcontrollers, reduced instruction set computers (RISC), application-specific integrated circuits (ASICs), logic circuits, GPUs, FPGAs, and any other circuit or processor capable of executing the functions described herein. The above examples are exemplary only, and are thus not intended to limit in any way the definition and/or meaning of the term "module" or "computer."

The computer, module, or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer, module, or processor as a processing machine to perform specific operations such as the methods and processes of the various embodiments described and/or illustrated herein. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the disclosure without departing from their scope. While the dimensions and types of materials described herein are intended to define the parameters of the various embodiments of the disclosure, the embodiments are by no means limiting and are exemplary embodiments. Many other embodiments will be apparent to those of skill in the art upon reviewing the above description. The scope of the various embodiments of the disclosure should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

This written description uses examples to disclose the various embodiments of the disclosure, including the best mode, and also to enable any person skilled in the art to practice the various embodiments of the disclosure, including making and using any devices or systems and performing any incorporated methods. The patentable scope of the various embodiments of the disclosure is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal language of the claims.

What is claimed is:

1. A serializer comprising:
   a recursive tree of serializer unit cells, wherein each serializer unit cell comprises:
      a multiplexer;
      a plurality of flip-flops coupled to the multiplexer; and
      a state machine configured to define operation of the corresponding serializer unit cell;
   wherein the recursive tree is organized with upper level serializer unit cells disposed more closely to a serializer output than are lower level serializer unit cells, and wherein the recursive tree is configured such that each serializer unit cell that is adjacent to and in an upper position relative to a corresponding lower level serializer unit cell directs the corresponding lower level serializer unit cell to output data, and the corresponding lower level serializer unit cell communicates to the serializer unit cell when the corresponding lower level serializer unit cell is done outputting data.

2. The serializer of claim 1, wherein each serializer unit cell is configured to operate to output data until all bits for subtrees of the serializer unit cell are exhausted.

3. The serializer of claim 1, wherein each serializer unit cell in an upper position is a parent serializer unit cell and is coupled to a first child serializer unit cell and a second child serializer unit cell, and wherein the first child serializer unit cell is upper relative to the second child serializer unit cell.

4. The serializer of claim 3, wherein each parent serializer unit cell is configured to direct the first child serializer unit cell to serialize data, and to direct the second child serializer unit cell to serialize data responsive to completion of serialization by the first child serializer unit cell.

5. The serializer of claim 1, wherein the multiplexer is a 4:1 multiplexer.

6. A deserializer comprising:
a recursive tree of deserializer unit cells, wherein each deserializer unit cell comprises:
a demultiplexer;
a plurality of flip-flops coupled to the demultiplexer; and
a state machine configured to define operation of the corresponding deserializer unit cell;
wherein the recursive tree is organized with lower level deserializer unit cells disposed more closely to deserializer output registers of a serializer/deserializer link than are upper level deserializer unit cells, and wherein the recursive tree is configured such that each deserializer unit cell that is adjacent to and in an upper position relative to a corresponding lower level deserializer unit cell directs the corresponding lower level deserializer unit cell to deserialize data, and the corresponding lower level deserializer unit cell communicates to the deserializer unit cell when the corresponding lower level deserializer unit cell is done deserializing data.

7. The deserializer of claim 6, wherein each deserializer unit cell is configured to operate to deserialize data until all bits for a subtree of that deserializer unit cell are output to the deserializer output registers belonging to that subtree, after which the deserializer issues a DONE signal to an immediately adjacent upper level deserializer unit cell, and wherein the immediately adjacent upper level deserializer unit cell is configured to, responsive to receiving the DONE signal from the deserializer unit cell, begin deserializing data to another lower level cell, or deserialize a last bit in a subtree of an upper level deserializer unit cell and issue a DONE signal to a corresponding upper level deserializer unit cell.

8. The deserializer of claim 6, wherein each upper deserializer unit cell is coupled to a first lower deserializer unit cell and a second lower deserializer unit cell.

9. The deserializer of claim 8, wherein the upper deserializer unit cell is configured to direct the first lower deserializer unit cell to deserialize data, and to direct the second lower deserializer unit cell to deserialize data responsive to completion of deserialization by the first lower deserializer unit cell.

10. The deserializer of claim 6, wherein the demultiplexer is a 4:1 demultiplexer.

11. A serializer/deserializer system comprising:
a first serializer and a second serializer, each comprising:
a recursive tree of serializer unit cells, wherein each serializer unit cell comprises:
a multiplexer;
a plurality of flip-flops coupled to the multiplexer; and
a state machine configured to define operation of the corresponding serializer unit cell;
wherein the recursive tree is organized with upper level serializer unit cells disposed more closely to a serializer output than are lower level serializer unit cells, and wherein the recursive tree is configured such that each serializer unit cell that is adjacent to and in an upper position relative to a corresponding lower level serializer unit cell directs the corresponding lower level serializer unit cell to output data, and the corresponding lower level serializer unit cell communicates to the serializer unit cell when the corresponding lower level serializer unit cell is done outputting data;
a serializer/deserializer link and associated analog electronics; and
a first deserializer and a second deserializer, wherein the second deserializer is coupled to the first serializer via the serializer/deserializer link and is configured to receive serialized data from the first serializer via the serializer/deserializer link, wherein the first deserializer is coupled to the second serializer via the serializer/deserializer link and is configured to receive serialized data from the second serializer via the serializer/deserializer link, and wherein the first deserializer and the second deserializer each comprise:
a recursive tree of deserializer unit cells, wherein each deserializer unit cell comprises:
a demultiplexer;
a plurality of flip-flops coupled to the demultiplexer; and
a state machine configured to define operation of the corresponding deserializer unit cell;
wherein the recursive tree is organized with lower level deserializer unit cells disposed more closely to an output register of the serializer/deserializer link than are upper level deserializer unit cells, and wherein the recursive tree is configured such that each deserializer unit cell that is adjacent to and in an upper position relative to a corresponding lower level deserializer unit cell directs the corresponding lower level deserializer unit cell to deserialize data, and the corresponding lower level deserializer unit cell communicates to the deserializer unit cell when the corresponding lower level deserializer unit cell is done deserializing data; and
wherein the first serializer is positioned on a first side of the serializer/deserializer link medium with the first deserializer, and wherein the second serializer is positioned on a second side of the serializer/deserializer link medium with the second deserializer.

12. The serializer/deserializer system of claim 11, wherein each serializer unit cell is configured to operate to output data until all bits for the serializer unit cell are exhausted, and wherein an immediately adjacent upper serializer unit cell begins outputting data responsive to exhaustion of all bits for one or more immediately adjacent lower serializer unit cells.

13. The serializer/deserializer system of claim 11, wherein each upper level serializer unit cell is coupled to a first lower level serializer unit cell and a second lower level serializer unit cell.

14. The serializer/deserializer system of claim 13, wherein the upper level serializer unit cell is configured to direct the first lower level serializer unit cell to serialize data, and to direct the second lower level serializer unit cell to serialize data responsive to completion of serialization by the first lower level serializer unit cell.

15. The serializer/deserializer system of claim 11, wherein the multiplexer is a 4:1 multiplexer.

16. The serializer/deserializer system of claim 11, wherein each deserializer unit cell is configured to operate to deserialize data until all bits for a subtree of that deserializer unit cell are output to the deserializer output registers belonging to that subtree, after which the deserializer issues a DONE signal to an immediately adjacent upper level deserializer unit cell, and wherein the immediately adjacent upper level deserializer unit cell is configured to, responsive to receiving the DONE signal from the deserializer unit cell, begin deserializing data to another lower level cell, or deserialize a last bit in a subtree of an upper level deserializer unit cell and issue a DONE signal to a corresponding upper level deserializer unit cell.

17. The serializer/deserializer system of claim 11, wherein each upper deserializer unit cell is coupled to a first lower deserializer unit cell and a second lower deserializer unit cell.

18. The serializer/deserializer system of claim 17, wherein the upper deserializer unit cell is configured to direct the first lower deserializer unit cell to deserialize data, and to direct the second lower deserializer unit cell to deserialize data responsive to completion of deserialization by the first lower deserializer unit cell.

19. The serializer/deserializer system of claim 11, wherein the demultiplexer is a 4:1 demultiplexer.

20. The serializer/deserializer system of claim 11, wherein the system is configured to use a "DATA TYPE" bit to identify a nature of data being transmitted in each data frame.

* * * * *